(12) United States Patent
Waniuk et al.

(10) Patent No.: US 9,945,017 B2
(45) Date of Patent: Apr. 17, 2018

(54) TAMPER RESISTANT AMORPHOUS ALLOY JOINING

(75) Inventors: Theodore Andrew Waniuk, Lake Forest, CA (US); Tran Quoc Pham, Anaheim, CA (US); Dennis Ogawa, Rancho Santa Margarita, CA (US)

(73) Assignee: CRUCIBLE INTELLECTUAL PROPERTY, LLC, Rancho Santa Margarita, CA (US)

( * ) Notice: Subject to any disclaimer, the term of this patent is extended or adjusted under 35 U.S.C. 154(b) by 599 days.

(21) Appl. No.: 14/348,399

(22) PCT Filed: Sep. 30, 2011

(86) PCT No.: PCT/US2011/054244
§ 371 (c)(1),
(2), (4) Date: May 29, 2014

(87) PCT Pub. No.: WO2013/048442
PCT Pub. Date: Apr. 4, 2013

(65) Prior Publication Data
US 2014/0283959 A1 Sep. 25, 2014

(51) Int. Cl.
*C22C 45/00* (2006.01)
*H01L 23/10* (2006.01)
*H01L 23/00* (2006.01)

(52) U.S. Cl.
CPC .............. *C22C 45/00* (2013.01); *H01L 23/10* (2013.01); *H01L 23/573* (2013.01); *H01L 2924/0002* (2013.01)

(58) Field of Classification Search
CPC ..... C22C 14/00; C22C 16/00; C22C 2200/02; H01L 23/10; H01L 23/57; H01L 23/573; H01L 2924/00; H01L 2924/0002
See application file for complete search history.

(56) References Cited

U.S. PATENT DOCUMENTS

| | | |
|---|---|---|
| 5,288,344 A | 2/1994 | Peker et al. |
| 5,368,659 A | 11/1994 | Peker et al. |
| 5,482,580 A | 1/1996 | Scruggs et al. |
| 5,618,359 A | 4/1997 | Lin et al. |
| 5,735,975 A | 4/1998 | Lin et al. |
| 6,325,868 B1 | 12/2001 | Kim et al. |

(Continued)

FOREIGN PATENT DOCUMENTS

| | | |
|---|---|---|
| DE | 3133599 | 3/1983 |
| EP | 0723031 A2 | 7/1996 |

(Continued)

OTHER PUBLICATIONS

International Search Report/Written Opinion, PCT/ISA/210, PCT/ISA/220, PCT/ISA/237, dated Jun. 26, 2012, total of pages, for PCT/US2011/054244.

(Continued)

*Primary Examiner* — Scott Kastler
*Assistant Examiner* — Vanessa T Luk
(74) *Attorney, Agent, or Firm* — Foley & Lardner LLP

(57) ABSTRACT

A method to form an enclosure or assembly which is fitted together and joined via a thermoplastic forming operation in order to seal the enclosure and hinder attempts to tamper with the contents.

13 Claims, 5 Drawing Sheets (left to right)

(56) References Cited

U.S. PATENT DOCUMENTS

| | | | |
|---|---|---|---|
| 6,818,078 B2 * | 11/2004 | Kim | C22C 45/10 |
| | | | 148/403 |
| 7,575,040 B2 | 8/2009 | Johnson | |
| 7,947,134 B2 * | 5/2011 | Lohwongwatana | C22C 45/00 |
| | | | 148/522 |
| 2008/0251164 A1 * | 10/2008 | Lohwongwatana | C22C 45/00 |
| | | | 148/528 |
| 2008/0278217 A1 * | 11/2008 | Hankhofer | H05K 5/0208 |
| | | | 327/509 |

FOREIGN PATENT DOCUMENTS

| | | | | |
|---|---|---|---|---|
| EP | 0723031 A3 | 8/1996 | | |
| JP | 2001303218 | 10/2001 | | |
| WO | WO 2008124623 A1 * | 10/2008 | | C22C 45/00 |
| WO | WO 2009070701 A1 * | 6/2009 | | C22C 16/00 |

OTHER PUBLICATIONS

Akihisa Inoue et al., Bulk amorphous alloys with high mechanical strength and good soft magnetic properties in Fe-TM-B (TM=IV-VIII group transition metal) system, American Institute of Physics, vol. 71, No. 4, Jul. 28, 1997, pp. 464-466.

Satoshi Semboshi et al., Effects of Aging Temperature on Electrical Conductivity and Hardness of Cu-3 at. pct Ti Alloy Aged in a Hydrogen Atmosphere, Metallurgical and Materials Transactions, vol. 42A, Aug. 2011, pp. 2136-2143.

Shen et al., Bulk Glassy Co43Fe20Ta5.5B31.5 Alloy with High Glass-Forming Ability and Good Soft Magnetic Properties, Materials Transactions, vol. 42, No. 10, 2001, pp. 2136-2139.

\* cited by examiner

Figure 3(a) to 3(c) (top to bottom)
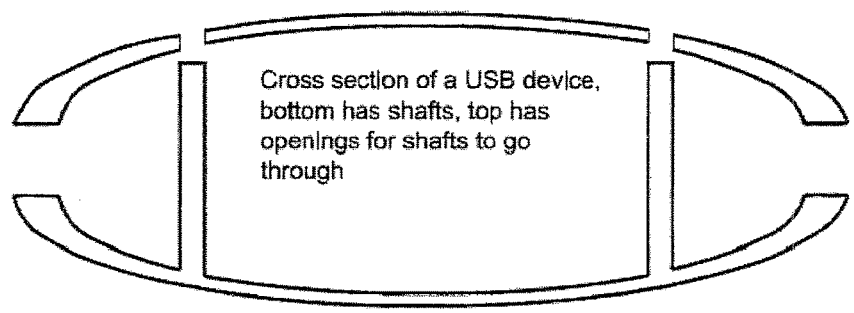
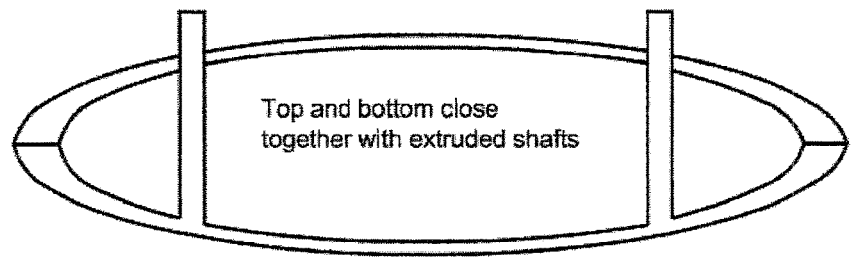
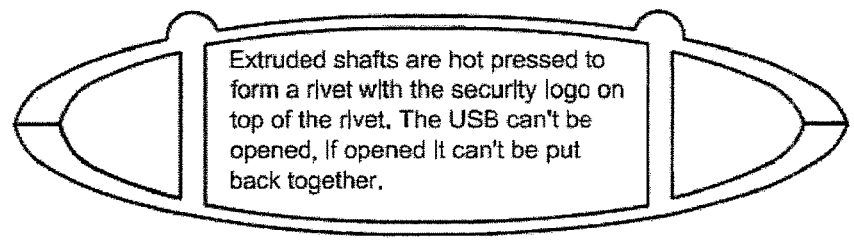

Figure 4(a) to 4(b) (left to right)
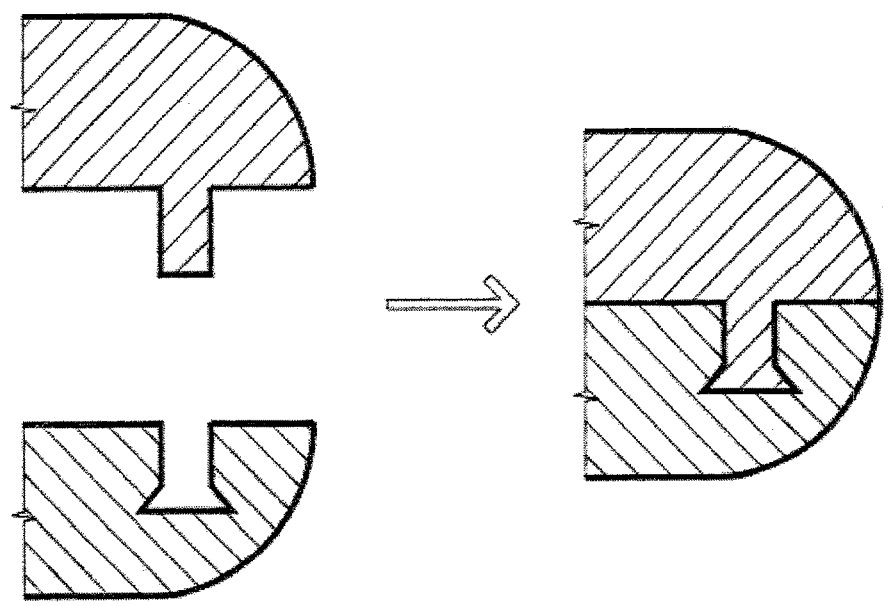

Figure 5(a) to 5(b) (left to right)
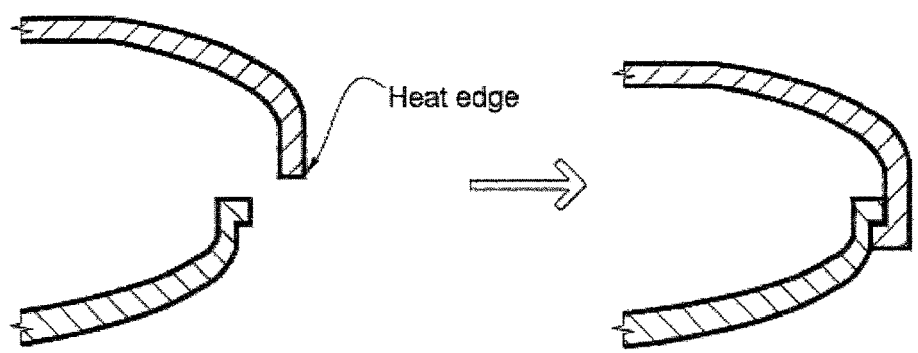

TAMPER RESISTANT AMORPHOUS ALLOY JOINING

The present invention relates to tamper resistant bulk-solidifying amorphous metal alloy joining and parts thereof.

BACKGROUND

Tampering involves the deliberate altering or adulteration of a product, package, or system. Tamper resistance is resistance to tampering by either the normal users of a product, package, or system or others with physical access to it. There are many reasons for employing tamper resistance. Tamper resistance ranges from simple features like screws with special heads, more complex devices that render themselves inoperable or encrypt all data transmissions between individual chips, or use of materials needing special tools and knowledge. Tamper-resistant devices or features are common on packages to deter package or product tampering. In some applications, devices are only tamper-evident rather than tamper-resistant.

It has been argued that it is very difficult to make simple devices, particularly electronic devices, secure against tampering, because numerous attacks are possible, including: physical attack of various forms (microprobing, drills, files, solvents, etc.), freezing the device, applying out-of-spec voltages or power surges, applying unusual clock signals, and inducing software errors using radiation (e.g. microwaves or ionizing radiation). However, there is a need to arrive at a simple, but effective, tamper resistant joining that would at least obviate some of the possible attacks, particularly physical attack. A proposed solution according to embodiments herein for tamper resistance is an enclosure or assembly having tamper resistant bulk-solidifying amorphous alloy joints, wherein the enclosure or assembly is fitted together and joined via a thermoplastic forming operation, for example, in order to seal the enclosure and hinder attempts to tamper with the contents.

SUMMARY

The embodiments herein comprise an enclosure or assembly which is fitted together and joined via a thermoplastic forming operation in order to seal the enclosure and hinder attempts to tamper with the contents.

Thermoplastic forming (TPF) of amorphous alloys involves heating amorphous feedstock, including die cast/injection molded shapes or parts, above its glass transition temperature in order to soften it. In this softened, metastable state, the alloy can be shaped using relatively low forming pressures, and it will remain amorphous after it has been cooled back down to room temperature, retaining its extremely high strength, hardness, and elasticity. If an enclosure were cast and which incorporated, for example, rod or pin-shaped protrusions, these protrusions could be subsequently heated in order to soften them, allowing them to be formed in a manner analogous to riveting. The heating process could involve resistive, inductive, radiative, frictional, or other types of heating and would confine the heated zone to a narrow region near the tip necessary for joining.

BRIEF DESCRIPTION OF THE DRAWINGS

FIGS. 3(a) to 3(c) provide a schematic of an exemplary embodiment of amorphous alloy tamper resistant systems. The bulk amorphous alloy has a critical thickness of (a) and the final part could have the smallest dimension that is thicker than the critical thickness (>a).

FIGS. 4(a) and 4(b) provide a schematic of an exemplary embodiment of amorphous alloy tamper resistant systems.

FIGS. 5(a) and 5(b) provide a schematic of an exemplary embodiment of amorphous alloy tamper resistant systems.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled to retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
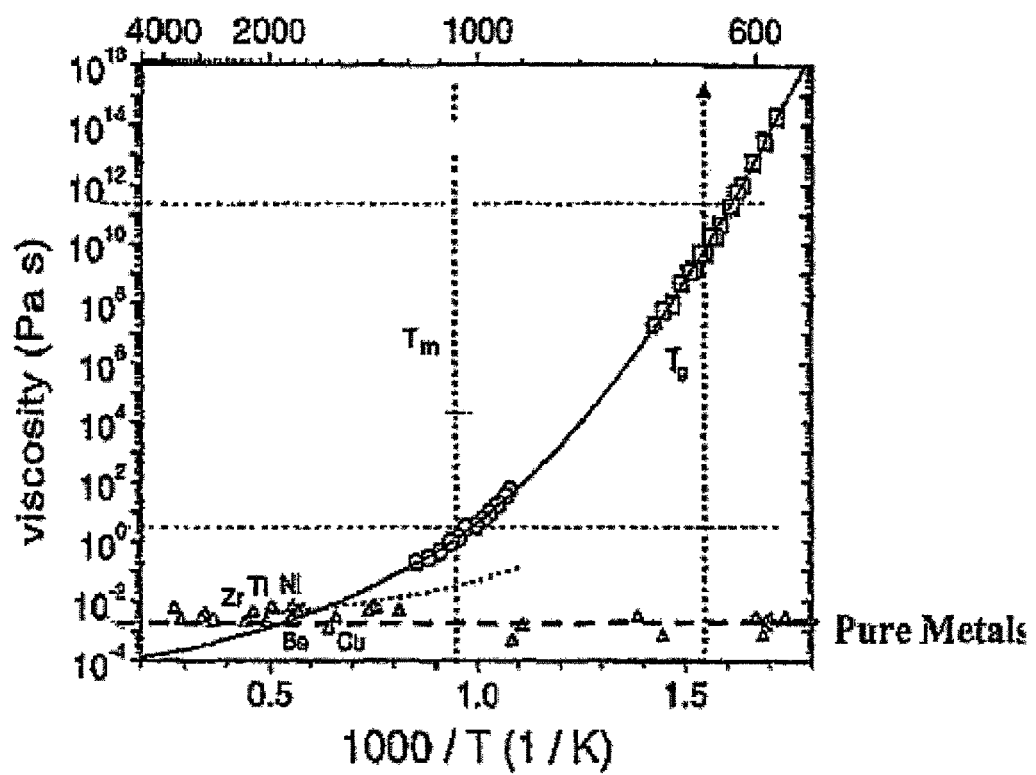
FIG. 1 provides a temperature-viscosity diagram of an exemplary bulk solidifying amorphous alloy.

FIG. 1 (obtained from U.S. Pat. No. 7,575,040) shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
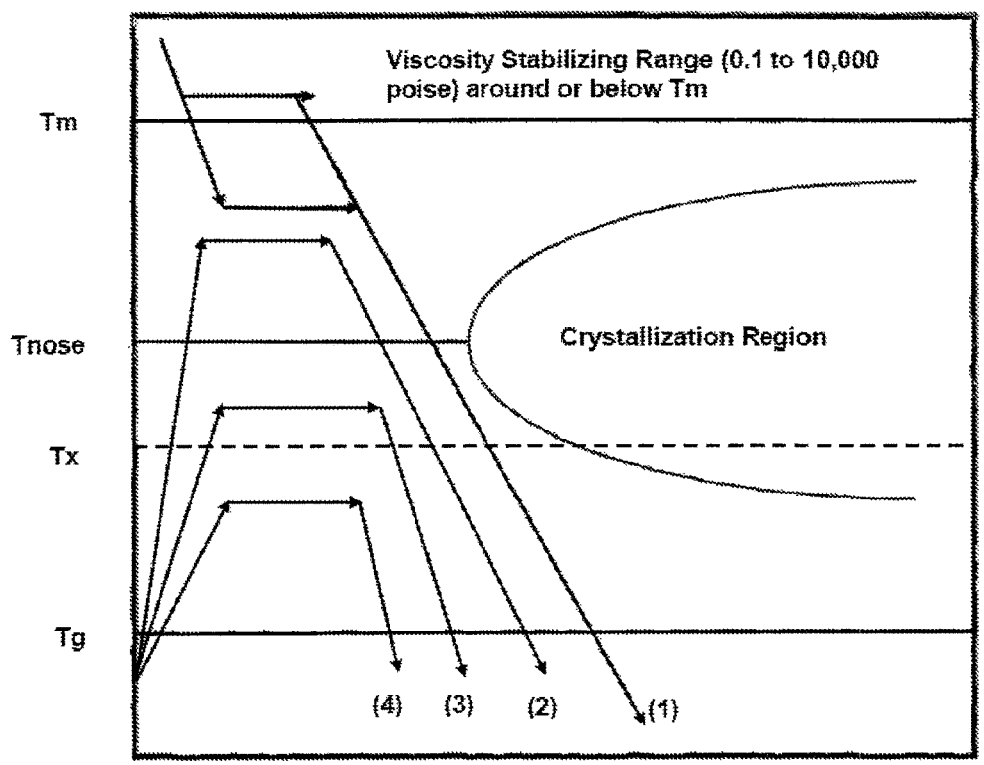
FIG. 2 provides a schematic of a time-temperature-transformation (TTT) diagram for an exemplary bulk solidifying amorphous alloy.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" could provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 2, Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The procssing methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one could have not reached Tx.

Typical differential scanning calorimeter (DSC) heating curves of bulk-solidifying amorphous alloys taken at a heating rate of 20 degree C./min describe, for the most part, a particular trajectory across the TTT data where one could likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data could show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context.

These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function: $G(x,x')=\langle s(x),s(x')\rangle$.

In the above function, s is the spin quantum number and x is the distance function within the particular system. This function is equal to unity when $x=x'$ and decreases as the distance $|x-x'|$ increases. Typically, it decays exponentially to zero at large distances, and the system is considered to be disordered. If, however, the correlation function decays to a constant value at large $|x-x'|$, then the system can be said to possess long-range order. If it decays to zero as a power of the distance, then it can be called quasi-long-range order. Note that what constitutes a large value of $|x-x'|$ is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. In one embodiment, the alloy composition is at least substantially not amorphous, such as being substantially crystalline, such as being entirely crystalline.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm. Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition could form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films. Thin films of amorphous metals can be deposited as protective coatings via a high velocity oxygen fuel technique.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction of weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the aforedescribed alloy system is a Zr—Ti—Ni—Cu—Be based amorphous alloy under the trade name Vitreloy™, such as Vitreloy-1 and Vitreloy-101, as fabricated by Liquidmetal Technologies, CA, USA. Some examples of amorphous alloys of the different systems are provided in Table 1.

The amorphous alloys can also be ferrous alloys, such as (Fe, Ni, Co) based alloys. Examples of such compositions are disclosed in U.S. Pat. Nos. 6,325,868; 5,288,344; 5,368, 659; 5,618,359; and U.S. Pat. No. 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

TABLE 1

Exemplary amorphous alloy compositions

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | Sn 0.50% | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Au 49.00% | Ag 5.50% | Pd 2.30% | Cu 26.90% | Si 16.30% | |
| 13 | Au 50.90% | Ag 3.00% | Pd 2.30% | Cu 27.80% | Si 16.00% | |
| 14 | Pt 57.50% | Cu 14.70% | Ni 5.30% | P 22.50% | | |
| 15 | Zr 36.60% | Ti 31.40% | Nb 7.00% | Cu 5.90% | Be 19.10% | |
| 16 | Zr 38.30% | Ti 32.90% | Nb 7.30% | Cu 6.20% | Be 15.30% | |
| 17 | Zr 39.60% | Ti 33.90% | Nb 7.60% | Cu 6.40% | Be 12.50% | |
| 18 | Cu 47.00% | Ti 34.00% | Zr 11.00% | Ni 8.00% | | |
| 19 | Zr 55.00% | Co 25.00% | Al 20.00% | | | |

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In one embodiment, the final parts exceeded the critical casting thickness of the bulk solidifying amorphous alloys.

In embodiments herein, the existence of a supercooled liquid region in which the bulk-solidifying amorphous alloy can exist as a high viscous liquid allows for superplastic forming. Large plastic deformations can be obtained. The ability to undergo large plastic deformation in the supercooled liquid region is used for the forming and/or cutting process. As oppose to solids, the liquid bulk solidifying alloy deforms locally which drastically lowers the required energy for cutting and forming. The ease of cutting and forming depends on the temperature of the alloy, the mold, and the cutting tool. As higher is the temperature, the lower is the viscosity, and consequently easier is the cutting and forming.

Embodiments herein can utilize a thermoplastic-forming process with amorphous alloys carried out between Tg and Tx, for example. Herein, Tx and Tg are determined from standard DSC measurements at typical heating rates (e.g. 20° C./min) as the onset of crystallization temperature and the onset of glass transition temperature.

The amorphous alloy components can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but preferably at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

Electronic Devices

The embodiments herein can be valuable in the fabrication of electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

Tamper Resistant Amorphous Alloy Joining

In one embodiment, the final parts exceeded the critical casting thickness of the bulk solidifying amorphous alloys.

In embodiments herein, the existence of a supercooled liquid region in which the bulk-solidifying amorphous alloy can exist as a high viscous liquid allows for superplastic forming. Large plastic deformations can be obtained. The ability to undergo large plastic deformation in the supercooled liquid region is used for the forming and/or cutting process. As oppose to solids, the liquid bulk solidifying alloy deforms locally which drastically lowers the required energy for cutting and forming. The ease of cutting and forming depends on the temperature of the alloy, the mold, and the cutting tool. As higher is the temperature, the lower is the viscosity, and consequently easier is the cutting and forming.

Embodiments herein can utilize a thermoplastic-forming process with amorphous alloys to create a joint in order to prevent tampering of a device. So because of the nature of the joint, it being a permanently deformed, typically comprising of two permanently deformed amorphous alloy surfaces, it would be impossible to remove the joint without actually fracturing the amorphous alloy. So in a way it is kind of utilizing the ability of amorphous alloys to lose their structural integrity when they crystallized. For example, the tamper resistant joint could be part of an enclosure having two halves that encloses an electronic device such as a tamper-resistant enclosure for a flash drive, specifically for a secure flash drive as shown in FIGS. 3(a) to 3(c). So not only a password protection would be incorporated into the flash drive but also a physical barrier to tampering would be a feature of the secure flash drive. FIG. 3(a) is a schematic of a bulk-solidifying amorphous alloy two-piece clam-shell structure wherein the bottom piece has shafts and the top piece has openings for the shafts to go through. FIG. 3(b) shows the top and bottom pieces closed together with the shafts extending through the opening in the top piece. The top ends of the shafts extending thorough the opening in the top piece are heated to a temperature between Tx and Tg, softened, pressed, deformed to form a rivet as shown in FIG. 3(c), and cooled. The shafts could be any type of protrusion such as pins or thins strips or some other geometric shape that has a relatively long aspect ratio.

Herein, Tx and Tg are determined from standard DSC (Differential Scanning calorimetry) measurements at typical heating rates (e.g. 20° C./min) as the onset of crystallization temperature and the onset of glass transition temperature.

The amorphous alloy components of the tamper resistant enclosure can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but always at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

In the embodiments of the tamper resistant joining, once one heats the amorphous alloy and produces the joint, the joint could either be allowed to remain amorphous or crystallized into a crystalline state. For example, if the joining process is a thermoplastic forming process, then by definition the shaft material of the shafts in FIGS. 3(a) to 3(c) is amorphous before and after the process. However, there could there be situations where one would purposely want the joint (head of rivet in FIG. 3(c)) to be crystalline and the rest of the shaft to remain amorphous. For example, there is one situation where one would wish to separate the top and bottom pieces at a later time. In this situation, one could selectively crystallize the deformed end in order to snap it off with much less effort. In short, basically in one embodiment one could use the high strength of the amorphous alloy to lock the casing together. In another embodiment, one could utilize the crystallized mechanical properties, namely the brittleness, to weaken intentionally the junction and reveal tampering.

Referring to FIGS. 4(a) and 4(b), one other possibility would be (instead of having a rod protrude entirely through the casing on the other side, i.e., the other half) to have a protrusion of some sort that mates with a whole of the other half, perhaps with undercuts that are shown on the other half. Prior to mating both halves, one could heat up the protrusion, soften it, mate the two halves together and make the softened protrusion spread out into the undercut and simultaneously fast cool the protrusion to form an interlock to lock the two halves while maintaining the interlock in an amorphous state. This embodiment would form a much more permanent type of bond.

Another embodiment that relates to an edge seal or a lip is shown in FIGS. 5(a) and 5(b), which is a cross-section of a casing, for example. According to this embodiment, one would take two parts, one of which contained a little excess material as a protrusion and one which contained a ridge possibly also with undercuts. The ridge portion would be illustrated by the bottom half of FIGS. 5(a) and 5(b). The top half would be the part that would be deformed. One could locally mate the two halves, perhaps with laser heating or something similar, or perhaps with a fixture of some sort, to form the enclosure. For example, one could use a fixture that is preheated, take the top half of the enclosure and put it into the fixture to selectively heat the entire edge, take the top half out of the fixture, mate it with the bottom half and then immediately form the top half around the bottom edge of the bottom half, thereby interlocking the two halves.

Uses of Tamper Resistant Amorphous Alloy Joining

One reason to use tamper resistant amorphous alloy joining would be if the enclosure is made of an amorphous alloy. In this case, tamper resistant amorphous alloy joining would be a useful technique of drawing those two halves and creating tamper resistant joints for those components that one does want to be tampered with, hence provide the tamper-resistant label. Amorphous alloys have extremely high strength compared to conventional metals and one would not have to go through a costly joining process involving solders or things like that. Furthermore, one could obviate the need for screws, fasteners, and things like that. And also, unlike soldering which is kind of a melt process, the tamper resistant amorphous alloy joining could be a thermoplastic-forming process, wherein one would require a little bit more force to mate and join amorphous alloys, but the force would not be nearly as extreme that needed for a weld or a brace, for example. Furthermore, thermoplastic-forming of amorphous alloys could done without be excessive heating, for example, at temperatures in the range of 300-500 degree C.—typically in the range of 400-500 C for Zr-based alloys and substantially lower for precious metal-based amorphous alloys. On the other hand, aluminum is typical forged in a temperature range near 540 C. Relative to amorphous alloys, it is not capable of substantial strains before fissures or cracks form. Amorphous alloy, on the other hand, softens dramatically and can undergo strains of hundreds of percent, limited only by the applied strain rate and the time until crystallization at a given process temperature. More importantly, amorphous alloys will exhibit their full strength and hardness immediately after the thermoplastic-forming process, and typical values are comparable to high strength steels or titanium alloys. Thus, this process is capable of generating high localized strains at relatively low temperatures while producing an extremely high strength junction with no additional heat treatment necessary. Furthermore, this junction will be difficult to separate without causing substantial damage to the joined parts.

Also, one could locally heat the area very precisely, for example by induction heating or laser heating. One could join an amorphous alloy to dissimilar materials. One could reheat the amorphous alloy in the vicinity of the junction to render it crystalline and brittle, thereby allowing it to be removed.

Tamper-resistant amorphous alloy joining could be used for tamper-resistant microprocessors that are used to store and process private or sensitive information, such as private keys or electronic money credit. To prevent an attacker from retrieving or modifying the information, the chips could designed so that the information is not accessible through external means by security encapsulation using tamper resistant amorphous alloy joining. Thereby, the chips can be accessed only by the embedded software, which could contain additional appropriate security measures. Examples of tamper-resistant chips include all secure cryptoprocessors, and chips used in smartcards, as well as a clipper chip. For example, the tamper-resistant chips may be designed to zeroise their sensitive data (especially cryptographic keys) if they detect penetration of their security encapsulation or out-of-specification environmental parameters. A chip may even be rated for "cold zeroisation", the ability to zeroise itself even after its power supply has been crippled. Additionally, the security encapsulation for chips could be designed in such a manner that the chips are internally pre-stressed, so the chip will fracture if the security encapsulation is interfered with.

Tamper resistance amorphous alloy joining could be used for smart cards, set-top boxes and other devices that use digital rights management. In this case the issue is about stopping the user from breaking the equipment or hurting themselves, and thereby either stopping them from extracting codes or acquiring and saving the decoded bitstream.

Tamper resistance amorphous alloy joining for nuclear reactors that are intended to be sold to countries that otherwise do not possess nuclear weapons need to be made tamper-resistant to prevent nuclear proliferation. For example, the tamper resistance amorphous alloy joining technique could be combined with detection and alarms in place that sound if attempts at entry are detected (which can then be responded to by the military).

Tamper resistance amorphous alloy joining can be built in or added to packaging. Examples include: extra layers of packaging (no single layer or component is "tamper-proof"); packaging which requires tools to enter; extra strong and secure packaging; packages which cannot be resealed; and tamper-evident seals and features.

What is claimed:

1. An article comprising a tamper evident amorphous alloy interlock, comprising:
   a first component formed from a unitary bulk solidifying amorphous alloy; and
   a second component retained to the first component wherein the second component is formed from a unitary bulk solidifying amorphous alloy and the second component comprises:
     a structural member comprising a substantially amorphous microstructure; and
     an interlock member comprising a crystalline microstructure different from the amorphous microstructure of the structural member.

2. The article of claim 1, wherein:
   the structural member comprises a shaft extending through a hole in the first component; and
   the interlock member comprises a head at an end of the shaft, the head overlapping a surface of the first component adjacent the hole.

3. The article of claim 1, wherein;
   the article is an enclosure for an electronic device; and
   the tamper evident amorphous alloy interlock seals the enclosure.

4. The article of claim 1, wherein the article comprises an electronic device between the first component and the second component.

5. The article of claim 1, wherein the bulk solidifying amorphous alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

6. The article of claim 1, wherein the bulk solidifying amorphous alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

7. The article of claim 1, wherein the interlock member is integrally formed-as a projection of the second component and the projection overlaps a ridge of the first component.

8. The article of claim 1, wherein the crystalline microstructure has at least 40 vol % crystalline phase.

9. An article, comprising:
   a first housing component defining a first portion of an interior volume of an electronic device and comprising a first interlock feature; and
   a second housing component of unitary construction defining a second portion of the interior volume of the electronic device and comprising:
     a body portion comprising a substantially amorphous form of a bulk solidifying amorphous alloy; and
     a second interlock feature comprising a substantially crystalline form of the bulk solidifying amorphous alloy and engaged with the first interlock feature to retain the second housing component to the first housing component.

10. The article of claim 9, wherein the first interlock feature defines an undercut.

11. The article of claim 9, wherein the first interlock feature extends around an outer perimeter of the first housing component.

12. The article of claim 9, wherein:
   the first interlock feature comprises a hole through the first housing component from an exterior surface of the first housing component to an interior surface of the first housing component; and the second interlock feature comprises:

a shaft extending through the hole; and a rivet head integrated with the shaft and engaged with the exterior surface of the first housing component to retain the second housing component to the first housing component.

13. The article of claim 12, wherein the rivet head comprises the substantially crystalline form of the bulk solidifying amorphous alloy.

\* \* \* \* \*